United States Patent [19]
Chorey et al.

[11] Patent Number: 6,154,664
[45] Date of Patent: *Nov. 28, 2000

[54] DUAL BAND CELLULAR PHONE WITH TWO POWER AMPLIFIERS AND POWER CONTROL CIRCUIT THEREFORE

[75] Inventors: Christopher M. Chorey, Newport Beach, Calif.; Iconomos A. Koullias; Luke T. Steigerwald, both of Reading, Pa.

[73] Assignee: Conexant System, Inc., Newport Beach, Calif.

[ * ] Notice: This patent is subject to a terminal disclaimer.

[21] Appl. No.: 09/103,897

[22] Filed: Jun. 24, 1998

[51] Int. Cl.$^7$ ...................................................... H04B 1/09
[52] U.S. Cl. ........................ 455/571; 455/103; 455/126; 455/127
[58] Field of Search ................................ 455/78, 82, 83, 455/84, 103, 127, 129, 115, 552, 553, 571, 575; 330/51, 126, 129, 279

[56] References Cited

U.S. PATENT DOCUMENTS

| | | | |
|---|---|---|---|
| 4,990,803 | 2/1991 | Gilbert | 307/492 |
| 5,126,686 | 6/1992 | Tam | 330/134 |
| 5,150,075 | 9/1992 | Hietala et al. | 330/279 |
| 5,422,931 | 6/1995 | Austin-Lazarus et al. | 379/59 |
| 5,432,473 | 7/1995 | Mattila et al. | 330/133 |
| 5,438,684 | 8/1995 | Schwent et al. | 455/89 |
| 5,530,923 | 6/1996 | Heinonen et al. | 455/126 |
| 5,768,691 | 6/1998 | Matero et al. | 455/78 |
| 5,774,017 | 6/1998 | Adar | 330/51 |
| 5,790,587 | 8/1998 | Smith et al. | 375/200 |
| 5,878,332 | 3/1999 | Wang et al. | 455/84 |
| 5,884,149 | 3/1999 | Jaakola | 455/103 |
| 5,896,562 | 4/1999 | Heinonen | 455/76 |

FOREIGN PATENT DOCUMENTS

WO 99/25064   5/1999   WIPO .

OTHER PUBLICATIONS

Specification: GSM Technical Specification GSM 05.05; Jul. 1996; Version 5.2.0; Entitled Digital cellular telecommunications systems (Phase 2+); Radio transmission and reception; European Telecommunications Institute pp. 8, 11, 14 and 33.

Lawrence J. Curran, "RFICs: Dual-Band Cell Phones Emerge"; *EDN*; May 22, 1997; pp. 21, 22, 24.

Datasheet; "RF230 GSM1800/PCS1900 Power Amplifier"; Rockwell Semiconductor Systems; Jan. 14, 1998.

"Track to Multi-band GSM"; Symbionics; *Wireless Week*; Jun. 30, 1997.

(List continued on next page.)

*Primary Examiner*—Daniel S. Hunter
*Assistant Examiner*—Pablo Tran
*Attorney, Agent, or Firm*—Knobbe, Martens, Olson & Bear, LLP.

[57] ABSTRACT

A transmitter for a cellular phone comprising an antenna and being operable at a first radio frequency band and a second radio frequency band is disclosed. The transmitter comprises a first power amplifier and a second power amplifier, one of which is active at a time. The first power amplifier has an input for a first signal at the first radio frequency band, an input for a first control signal and a first output for an amplified first signal. The first output is connectable to the antenna. The second power amplifier has an input for a second signal at the second radio frequency band, an input for a second control signal and a second output for an amplified second signal. The second output is connectable to the antenna. The transmitter further comprises a single control module associated with the first and second outputs of the power amplifiers. The control module generates a control signal for the active power amplifier. The control signal forms part of a feedback control loop, and is a function of the amplified signal output from the active power amplifier and a reference signal which defines a desired characteristic of the amplified signal.

27 Claims, 9 Drawing Sheets

OTHER PUBLICATIONS

Datasheet; "RF122 Power Amplifier Controller for Heterojunction Bipolar Transistor Power Amplifiers"; Rockwell Semiconductor Systems; Oct. 13, 1997.

Datasheet; "RF130 Power Amplifier for GSM applications"; Rockwell Semiconductor Systems; Dec. 3, 1997.

Fink, Christiansen et al; *Electronics Engineers' Handbook*; pp. 25–66–25–70.

PCT International Search Report, Oct. 6, 1999.

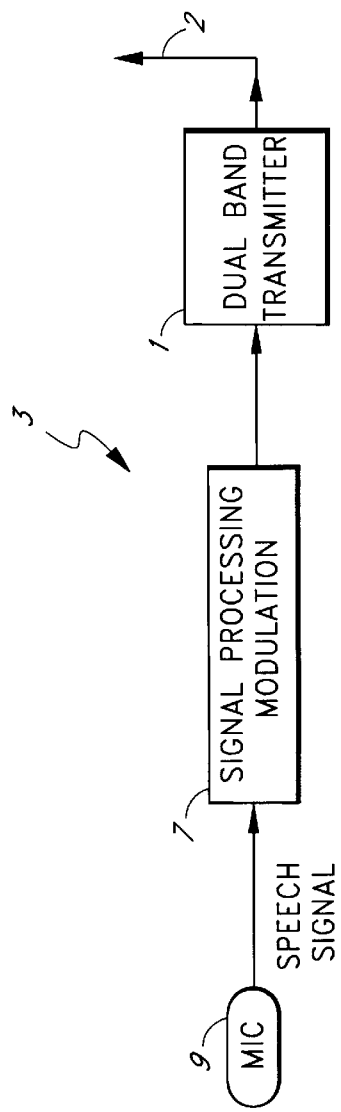
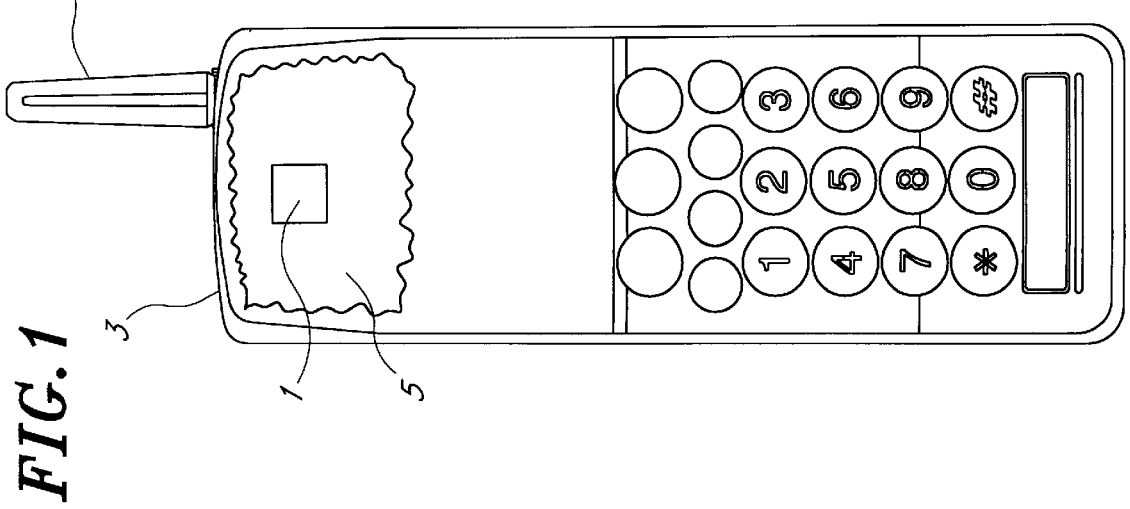
FIG. 1
FIG. 2

DUAL BAND CELLULAR PHONE WITH TWO POWER AMPLIFIERS AND POWER CONTROL CIRCUIT THEREFORE

BACKGROUND OF THE INVENTION

The invention relates to cellular phones used in mobile communications systems. More particularly, the invention relates to a circuit and a method for controlling electrical characteristics of a signal transmitted by a dual band cellular phone.

Usually, cellular phones are designed to operate within the environment of one of several mobile communications networks. One example of such an environment is a mobile communications network according to a standard known as GSM (Global System for Mobile communications) created by the European Telecommunications Standards Institute (ETSI). In GSM, there is an assigned frequency band around 900 MHz for Standard GSM, and an assigned frequency band around 1800 MHz for DCS1800 (Digital Communications System, DCS) which can be considered to be a further mobile communications environment. Other environments include systems known as Advanced Mobile Phone System (AMPS) operating in a frequency band around 800 MHz, and as Personal Communications System (PCS) operating in a frequency band around 1900 MHz.

As the number of users of cellular phones increases, some operators have added capacity to their networks by including more than only one frequency band in their networks. In the case of the GSM system, for example, the frequency bands around 900 MHz and 1800 MHz are now used to expand the capacities of certain networks.

Manufacturer of cellular phones, therefore, are developing a new generation of cellular phones which are operable at, for example, two frequency bands. A cellular phone operable at two frequency bands is referred to as a dual band cellular phone. As the dual band cellular phone has to transmit signals at both frequency bands, duplication of functions is required. Duplication of functions, however, leads to higher manufacturing costs and ultimately to higher prices for the dual band cellular phones.

SUMMARY OF THE INVENTION

There is therefore a need to keep the manufacturing costs caused by the duplication as low as possible. Further, there is a need to minimize size of dual band cellular phones because users have come to expect single band cellular phones to be small and to have an attractive design.

An aspect of the invention involves a transmitter for a cellular phone comprising an antenna and being operable at a first radio frequency band and a second radio frequency band. The transmitter comprises a first power amplifier and a second power amplifier. The first power amplifier has a first input for a first signal at the first radio frequency band, a first control input for a first control signal, and a first output for an amplified first signal. The first output is connectable to the antenna. The second power amplifier has a second input for a second signal at the second radio frequency band, a second control input for a second control signal, and a second output for an amplified second signal. The second output is connectable to the antenna. The transmitter further comprises a control module which is connectable to the first and second control inputs, and is configured to input a portion of an amplified signal into the control module. The control module generates a control signal to control one of the power amplifiers. The control signal is a function of the portion of the amplified signals and a reference signal.

Another aspect of the invention involves a cellular phone operable at a first radio frequency band and a second radio frequency band. The cellular phone comprises a transmitter having first and second power amplifiers and a single control module which is configured to control one of the power amplifiers at a time.

A further aspect of the invention involves a control module for controlling two power amplifiers in a cellular phone. The control module comprises a logarithmic detector and a differential amplifier. The logarithmic detector has an input for receiving a portion of an amplified signal and an output for a detector signal corresponding to the portion. The differential amplifier has an input for receiving a reference signal and an input for the detector signal. The differential amplifier generates an error signal which corresponds to a difference between the reference signal and the detector signal. The control module further comprises an integrator and a shaping circuit. The integrator integrates the error signal and generates an integrated error signal. The shaping circuit weights the integrated error signal in accordance with a preset characteristic to generate the control signal which equalizes nonlinear amplification characteristics of the power amplifiers.

An additional aspect of the invention involves a method for controlling electrical characteristics of a signal transmitted by a dual band cellular phone. The method comprises the step of providing a dual band transmitter which comprises a single control module and first and second power amplifiers which can be connected to an antenna. One of the first and second power amplifiers is activated at a time, and an RF signal is fed to the activated power amplifier. The activated power amplifier amplifies the RF signal and feeds the amplified RF signal to the antenna. A portion of the amplified RF signal is coupled from the amplified signal fed to the antenna and fed to the single control module. Within the control module, the portion of the RF signal is detected. The detected signal is compared with a reference signal to generate a control signal for the activated power amplifier. The generated control signal is fed to the activated power amplifier to provide an amplified RF signal which is in accordance with a desired signal characteristic defined by the reference signal.

BRIEF DESCRIPTION OF THE DRAWINGS

The above-mentioned and other features of the invention will now be described with reference to the drawings of a preferred embodiment of the power control circuit comprised in a dual band cellular phone. In the drawings, the same components have the same reference numerals. The illustrated embodiment is intended to illustrate, but not to limit the invention. The drawings contain the following figures:

FIG. 1 is a schematic illustration of a cellular phone cut away to show a portion of the motherboard;

FIG. 2 is a simplified illustration of a transmit path of the cellular phone shown in FIG. 1;

DETAILED DESCRIPTION OF THE PREFERRED EMBODIMENT

Figure 3A:
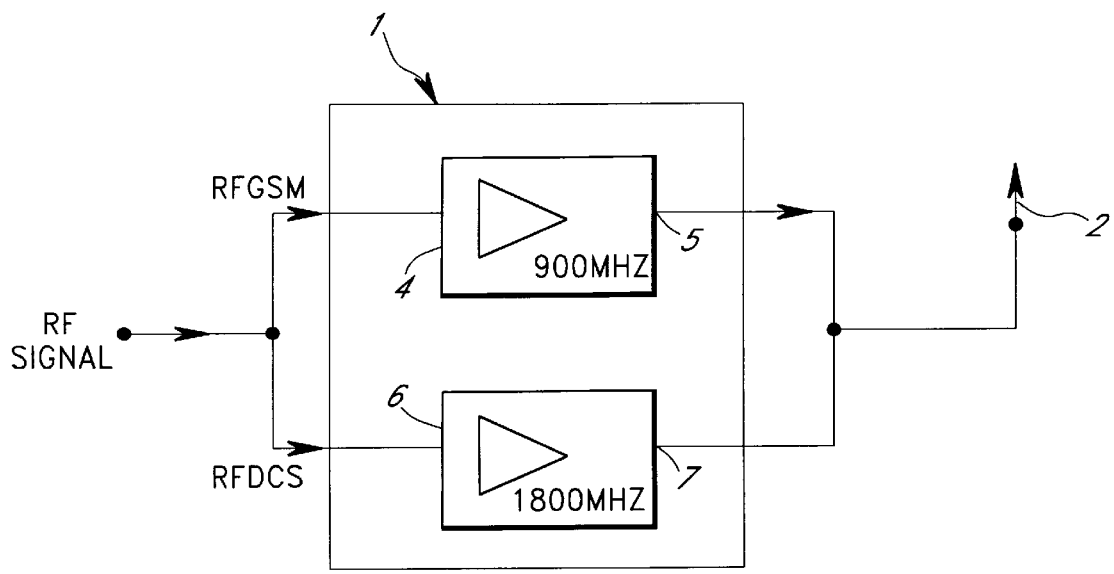
FIG. 3A shows a simplified block diagram of a dual band transmitter.

A mobile communications system, for example according to the GSM standard, is structured to have a variety of individual regions called cells, and to comprise a variety of fixed transmitter stations called base stations, and a plurality of mobile stations, the cellular phones. Usually, one base station defines one cell and handles telephone traffic to and from cellular phones which are currently located in the cell.

FIG. 1 schematically illustrates a dual band cellular phone 3 made in accordance with the invention including an antenna 2. A portion of the case of the dual band cellular phone 3 is cut away to show a motherboard 5 of the cellular phone 3 with a dual band transmitter 1 positioned thereon. Although not shown in FIG. 1, those skilled in the art will appreciate that the cellular phone 3 comprises a plurality of other components and functional modules, such as the components of a receive path and a transmit path. The cellular phone 3 further includes a display and a keypad.

The receive path of such a dual band cellular phone 3 includes a radio frequency (RF) receiver, an analog-to-digital converter, a demultiplexer and a demodulator. The transmit path comprises a multiplexer, modulator, digital-to-analog converter and an RF transmitter. Further functional modules include, for example, a channel coder/decoder and a speech coder/decoder. Both the RF receiver and the RF transmitter are usually connected to the antenna 2 by means of a diode switch which connects the antenna 2 either to the RF receiver or to the RF transmitter.

The RF transmitter comprises an amplifier stage for amplifying the RF signals according to electrical characteristics, for example, a defined power level versus time profile and a defined spectral mask, before the RF signals are fed to the antenna 2 and emitted as radio signals. The spectral mask and the power level versus time profile are defined in GSM Technical Specification GSM 05.05, July 1996, Version 5.2.0, entitled "Digital cellular telecommunications system (Phase 2+); Radio transmission and reception", Paragraph 4.2.2, and Annex B.

FIG. 2 illustrates a simplified embodiment of the transmit path of the dual band cellular phone 3. Within the cellular phone 3, a processing module 7 and the dual band transmitter 1 including two power amplifiers are positioned on the motherboard and interconnected between the antenna 2 and a microphone 9 of the cellular phone 3. In this simplified illustration, the processing module 7 performs most speech and signal processing in a transmit direction, for example, voice encoding and channel encoding. The signal processing further includes modulating an RF carrier of either 900 MHz or 1800 MHz in the present embodiment with the processed speech signal.

FIG. 3A shows a simplified block diagram of the dual band transmitter 1 shown in FIG. 1. The dual band transmitter 1 includes two power amplifiers 4, 6 connected to the antenna 2. The power amplifiers 4, 6 receive an RF signal from an RF signal source (not shown) located within the cellular phone 3. For instance, the RF signal source may be included in the processing module 7 shown in FIG. 2. In the illustrated embodiment, the RF carrier advantageously has a frequency of 900 MHz or 1800 MHz depending on which RF carrier (GSM900 or DCS1800) is chosen.

The power amplifiers 4, 6 are associated with a controller (not shown) located on the motherboard 5 shown in FIG. 1. This controller monitors and controls the power amplifiers 4, 6 to ensure that an amplified RF signal output from an activated power amplifier 4, 6 conforms, for example, with the defined output power level versus time profile (GSM 05.05). The controller compares the power of the RF signal fed to the antenna 2 with a reference signal and generates a control signal to control the active power amplifier 4, 6. Thereby, the active power amplifier 4, 6 and the controller form a feedback control loop, for example, a second order type 1 control loop.

In the illustrated embodiment, the power amplifier 4 operates at a frequency band around 900 MHz, and the power amplifier 6 operates at a frequency band around 1800 MHz. The power amplifier 4 may advantageously be the same as a power amplifier device RF130 available from Rockwell Semiconductor Systems as Order No. W229. The integrated amplifier circuit of the power amplifier device includes a three-stage amplifier with heterojunction bipolar transistors in Gallium Arsenide (GaAs) technology. The power amplifier 6 may advantageously be the same as a power amplifier device RF230 available from Rockwell Semiconductor Systems as Order No. W225. The integrated amplifier circuit of the power amplifier 6 also includes a three-stage amplifier with heterojunction bipolar transistors in Gallium Arsenide (GaAs) technology. Those skilled in the art will appreciate that other power amplifiers operating at these frequency bands can be used.

The power amplifier 4 receives an RF signal RFGSM, and the power amplifier 6 receives an RF signal RFDCS. However, those skilled in the art will appreciate that the power amplifiers 4, 6 can operate at another pair of frequency bands, for example, 900/1900 MHz. Because the cellular phone 3 can operate at the two frequencies, it is referred to as a dual band cellular phone. However, it is contemplated that only one power amplifier 4, 6 is active at a time.

Although the specific embodiments of the dual band transmitter 1 are described with reference to a dual band cellular phone, it is further contemplated that the invention is also applicable to cellular phones which can operate at more than two different frequency bands. These frequency bands may include those assigned for AMPS or PCS, or newly assigned frequency bands for mobile communications systems.

Which frequency band the cellular phone 3 uses to communicate with the base station is determined by external factors. That is, a user may deliberately set the cellular phone to operate in one of the two frequency bands depending on the mobile communications system (GSM900, DCS1800, GSM1900) the user chooses. Alternatively, the frequency band of the cellular phone 3 can be determined by the base station which currently serves the cellular phone 3. Depending on the current telephone traffic in the cell served by the base station, a dynamic change of the frequency band may be necessary to allow more telephone traffic. In this case, the base station causes the cellular phone 3 to operate in one of the two frequency bands.

Figure 3B:
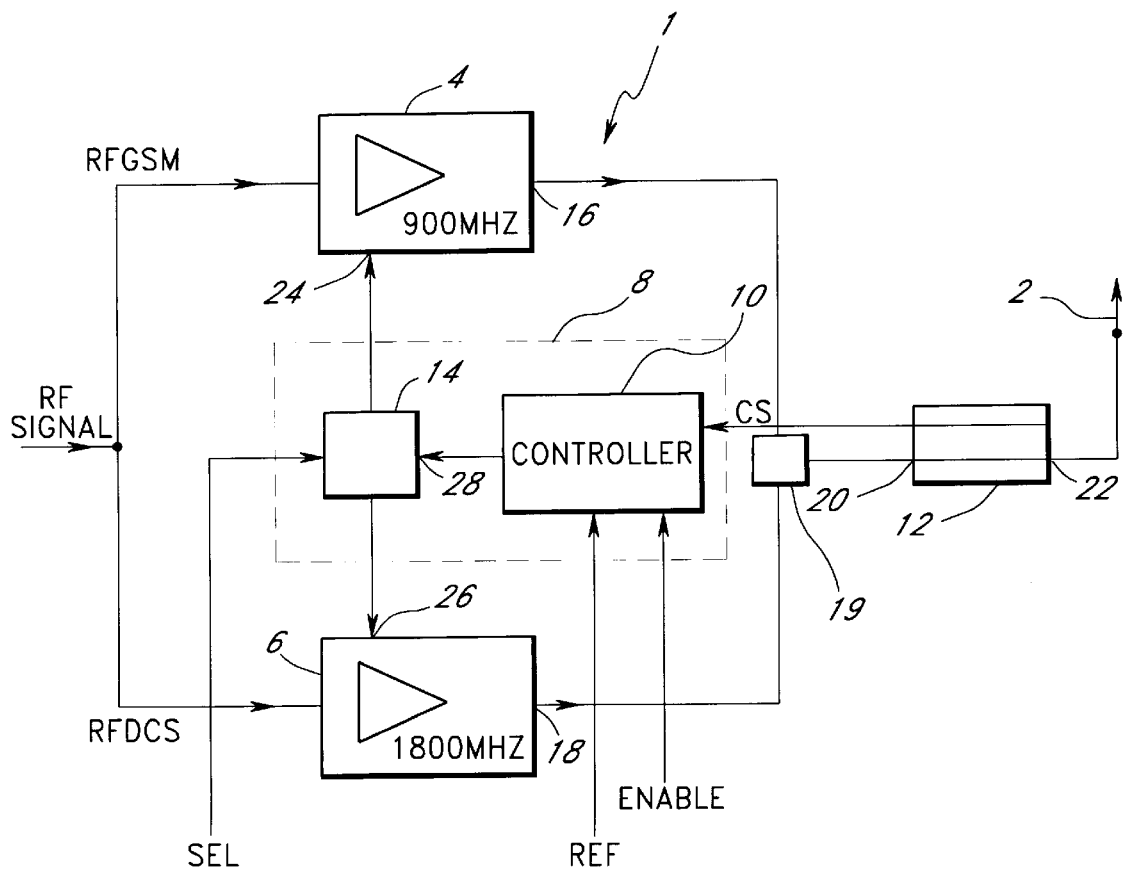
FIG. 3B shows a block diagram of a first embodiment of the dual band transmitter shown in FIG. 3A.

FIG. 3B shows a block diagram of a first embodiment of the dual band transmitter shown in FIG. 3A associated with a control module. An output 16 of the power amplifier 4 is connected to a first input of a diplexer 19, and an output 18 of the power amplifier 6 is connected to a second input of the diplexer 19. An output of the diplexer 19 is connected to an input 20 of an RF coupler 12, and an output 22 of the RF coupler 12 is connected to the antenna 2. Accordingly, each power amplifier 4, 6 can be connected to the antenna 2 via the diplexer 19. The diplexer 19 connects only one of the power amplifiers 4, 6 at a time to the RF coupler 12, and prevents that an RF signal from an active power amplifier 4, 6 is fed to the output 16, 18 of the inactive power amplifier 4, 6.

The dual band transmitter 1 further includes a control module 8 which controls the power amplifiers 4, 6 so that, for example, the prescribed power level versus time profile as defined in the GSM standard (GSM 05.05) is achieved and maintained. For illustrative purposes, the control module 8 is shown as having a switch 14 and a controller 10. However, those skilled in the art will appreciate that the illustrated division of the control module 8 is random and that other divisions are possible. The switch 14, which is controllable through an electrical signal, is connected to an input 24 of the power amplifier 4 and to an input 26 of the power amplifier 6. The control module 8 receives input signals and generates an output signal which is fed to an input 28 of the switch 14. The signals which the control module 8 receives include a signal ENABLE, a reference signal REF and a coupled RF signal CS. Besides the signal from the controller 10, the switch 14 receives a control signal SEL which operates the switch 14 between a first and second switch state to allow control of either the power amplifier 4 or the power amplifier 6. Preferably, the switch 14 is an electronic switch such as a diode switch.

In the illustrated preferred embodiment of the transmitter 1, the power amplifiers 4, 6 are controlled by a single control module 8. Thus, the power amplifiers 4, 6 share one control module 8 so that no duplication of control circuits is necessary resulting in cost savings for dual band cellular phones. By means of the control signal SEL, the control module 8 controls either the power amplifier 4 or 6. Thus, the control module 8 is part of two separate feedback control loops.

The RF coupler 12, for example, is a directional coupler which couples a portion CS, for instance −20 dB of a GSM signal and −15 dB of a DCS signal, of the amplified RF signal out and inputs this coupled portion CS of the amplified RF signal to the controller 10. Therefore, when the power level of the amplified RF signal changes, the power level of the portion CS changes also. Advantageously, the RF coupler 12 is made of two adjacent microstrips. The first microstrip is part of a trace connecting, via the diplexer 19, the power amplifiers 4, 6 and the antenna 2 and guiding the amplified RF signal. A portion of the amplified RF signal couples from the first microstrip to the second microstrip. This portion constitutes the coupled portion CS as stated above. The second microstrip guides the portion CS to the controller 10. The coupling efficiency of such an RF coupler 12 is determined by a spacing between the two microstrips and a length of the second microstrip with respect to the first microstrip. The second microstrip is on one end terminated with 50 ohms. At the end of the second microstrip, which is associated with the diplexer 19, a resistive attenuator and a filtering circuit are interposed between the coupler 12 and the controller 10. The attenuator and the filtering circuit adjust the power level and the frequency response of the coupler signal CS.

As stated above, the frequency band which the cellular phone uses to communicate with the base station is determined by external factors. An internal central controller (not shown) of the cellular phone 3 selects the RF carrier and generates the control signal SEL depending on these external factors. The control signal SEL controls the switch 14 to connect the controller 10 to the power amplifier 4 or to the power amplifier 6. As soon as the controller 10 is connected to one of the power amplifiers 4, 6 the respective power amplifier 4, 6 is activated while the other power amplifier 4, 6 remains deactive or is deactivated.

Figures 4, 7:
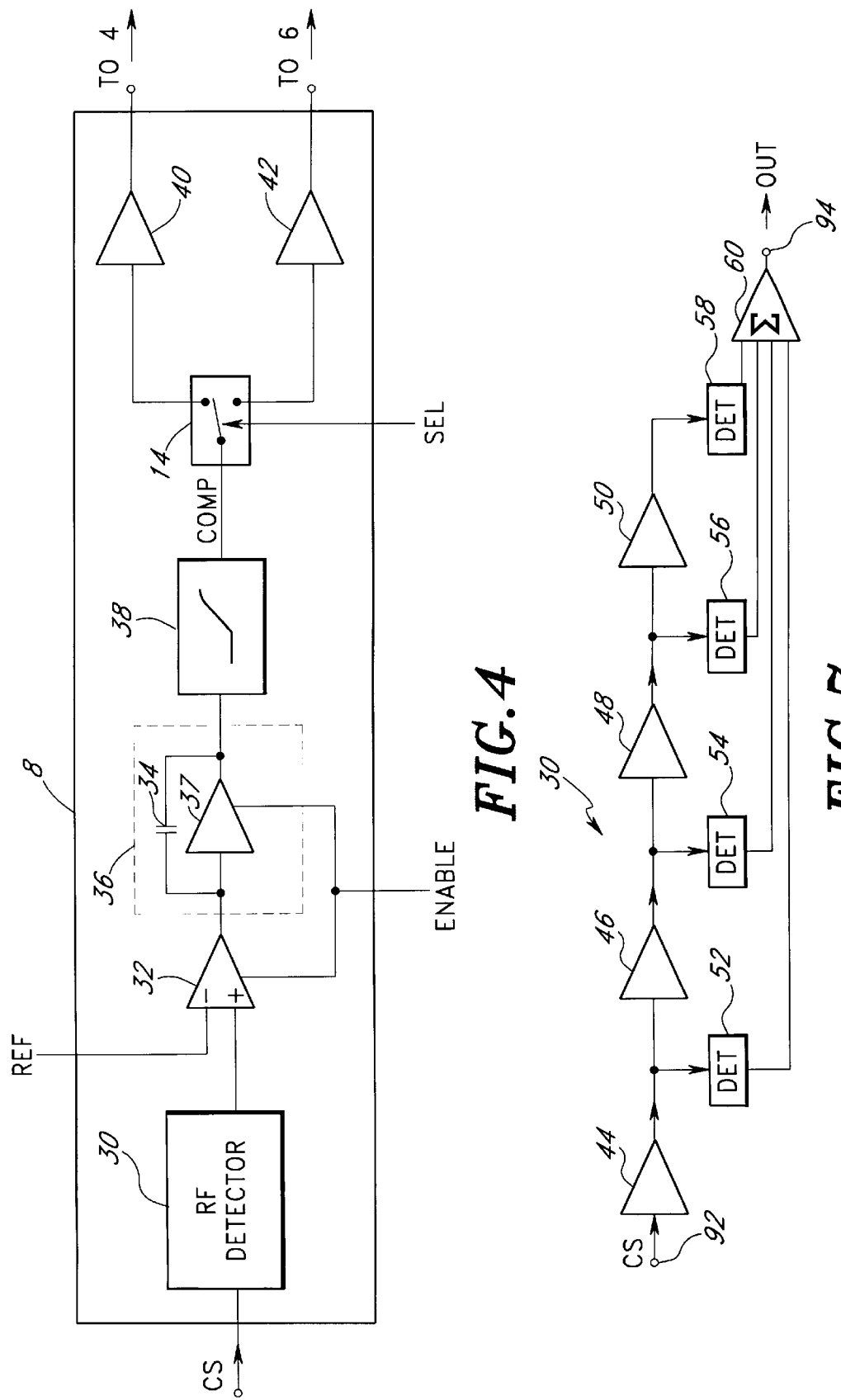
FIG. 4 is a block diagram of a first embodiment of a control module included in the dual band transmitter of FIG. 3.
FIG. 7 is a block diagram of a logarithmic RF detector.

FIG. 4 is a block diagram of a preferred embodiment of the control module 8 shown in FIG. 3B. The control module 8 receives the coupled RF signal CS and the signals REF, SEL and ENABLE. The control module 8 comprises a serial arrangement of an RF detector 30, a differential amplifier 32, an integrator 36 and a compensator 38. The coupled RF signal CS is input to the RF detector 30 which outputs a DC voltage that directly corresponds to the power level (in dBm) of the coupled RF signal CS and thereby indirectly to the amplified RF signal. Further, the properties of the RF detector 30 are preferably such that the DC voltage does not depend on the frequency of the input (coupled) signal CS, for instance, 900 MHz or 1800 MHz in the described embodiment.

The differential amplifier 32 compares this DC voltage with a voltage of the control signal REF and outputs an error signal (voltage) which is proportional to the difference (error) between the signals CS and REF. The reference signal REF has a shape which corresponds to the "ideal" power level versus time profile. Thus, the ideal and the actually emitted power level versus time profiles are compared.

The integrator 36 comprises an operational amplifier 37 and a capacitor 34 which determines a time constant of the integrator 36. For example, the time constant is about 1 millisecond which corresponds to a cut-off frequency of about 1 kHz. The integrator 36 outputs a signal which corresponds to the accumulated difference between the control signal REF and the coupled signal CS, i.e., the error signal. It is contemplated that a positive error (i.e, the reference signal REF is larger than the detected coupled portion CS of the RF signal) is added to, and that a negative error (i.e., the reference signal REF is smaller than the detected coupled portion CS of the RF signal) is subtracted from the accumulated error signal.

Ideally, the transfer functions of the power amplifiers 4, 6 are such that the output power levels of the RF signals are proportional to the control signals input to the inputs 24, 26 of the power amplifiers 4, 6, respectively. However, power amplifiers typically do not have a linear transfer function but a nonlinear transfer function. As the output power from the power amplifier 4, 6 increases, a given change of the control signal applied to the inputs 24, 26 produces a smaller change in the output power of the power amplifier 4, 6.

Figure 5:
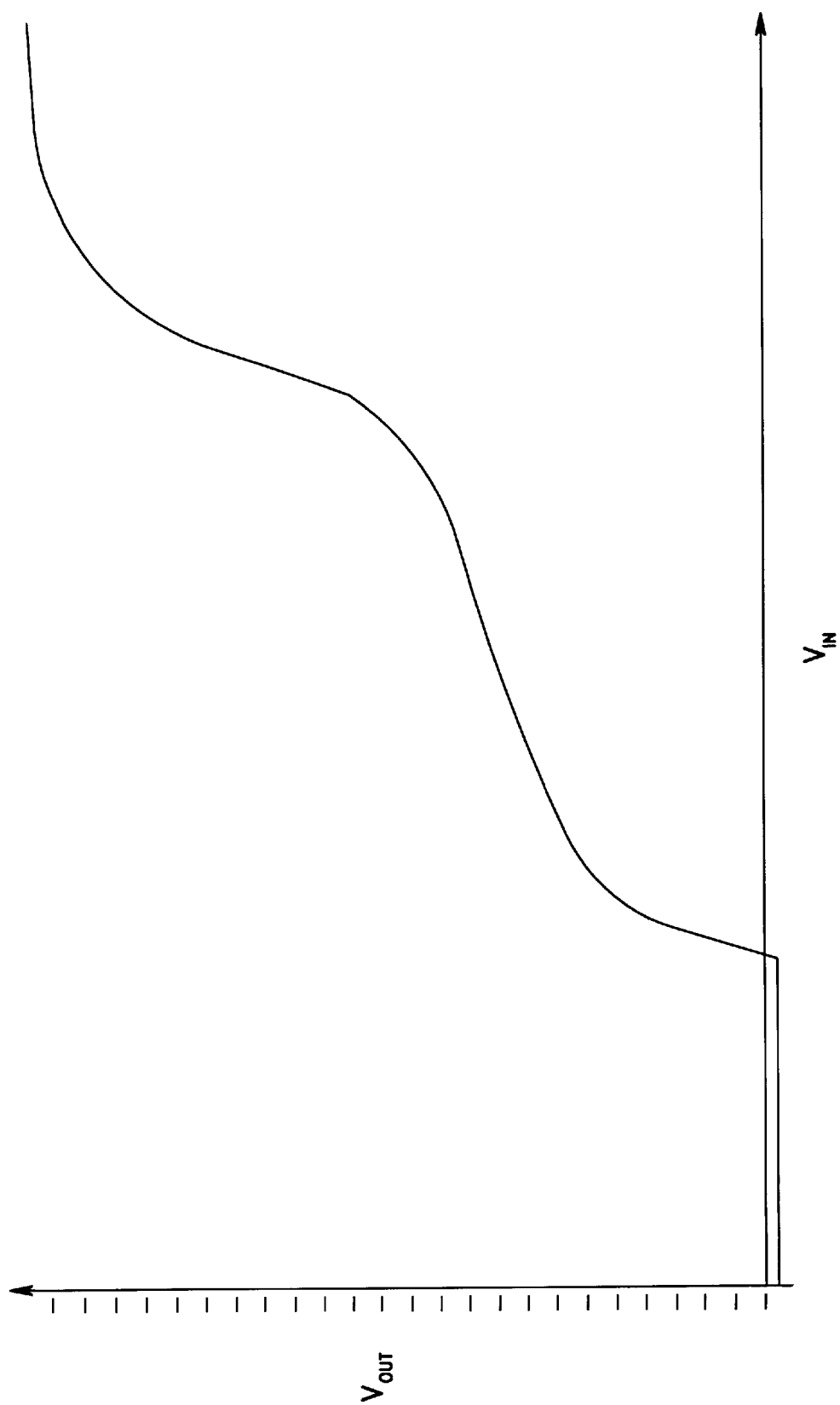
FIG. 5 is a graph of a preferred transfer function of a compensator included in the control module of FIG. 4.

The compensator 38 generates a compensation signal COMP which serves to compensate for such nonlinearities of the transfer functions of the power amplifiers 4, 6. The compensator 38 includes a circuit which weights the accumulated error signal in accordance with a shaping transfer function. A graph of an advantageous shaping transfer function is shown in FIG. 5 wherein the output voltage $V_{out}$ is a function of the input voltage $V_{in}$. The illustrated graph, which has approximately a wave-like shape along a line with a positive slope, generally shows that the greater the accumulated error signal, the more gain is applied to the signal.

This shape approximates a function which is complimentary to the transfer function of the power amplifiers 4, 6 such that a linear function is achieved. The feedback control loop formed by one of the power amplifiers 4, 6 and the control module 8 which includes the compensator 38, therefore, maintains a constant loop gain of about 40 dB.

The compensator 38 is connected to the switch 14 which is controlled by the control signal SEL. Depending on the position of the switch 14, the compensation signal COMP is either input to a driver amplifier 40 for GSM900 operation or input to a driver amplifier 42 for DCS1800 operation. The driver amplifier 40 is connected to the power amplifier 4, and the driver amplifier 42 is connected to the power amplifier 6. The driver amplifiers 40, 42 output signals, drive currents, to control the respective power amplifiers 4, 6. For instance, an increasing signal controls the power amplifier 4, 6 to increase the power level of the amplified RF signal. For instance, the driver amplifier 40 allows a maximal drive current of about 100 milliamperes in case a Rockwell RF130 power amplifier 4 is used, and the driver amplifier 42 allows a maximum drive current of about 80 milliamperes in case a Rockwell RF230 power amplifier 6 is used. The driver amplifiers 40, 42, therefore, limit the drive currents to upper limits to avoid excessive heating of the power amplifiers 4, 6.

The control module 8 has two switchable outputs which allows to provide two separate current limits for the power amplifiers 4, 6. Because the control module 8 is switchable, it is part of two feedback control loops, each including one power amplifier 4, 6. The control module 8, therefore, adjusts each loop gain independently.

Figure 6:
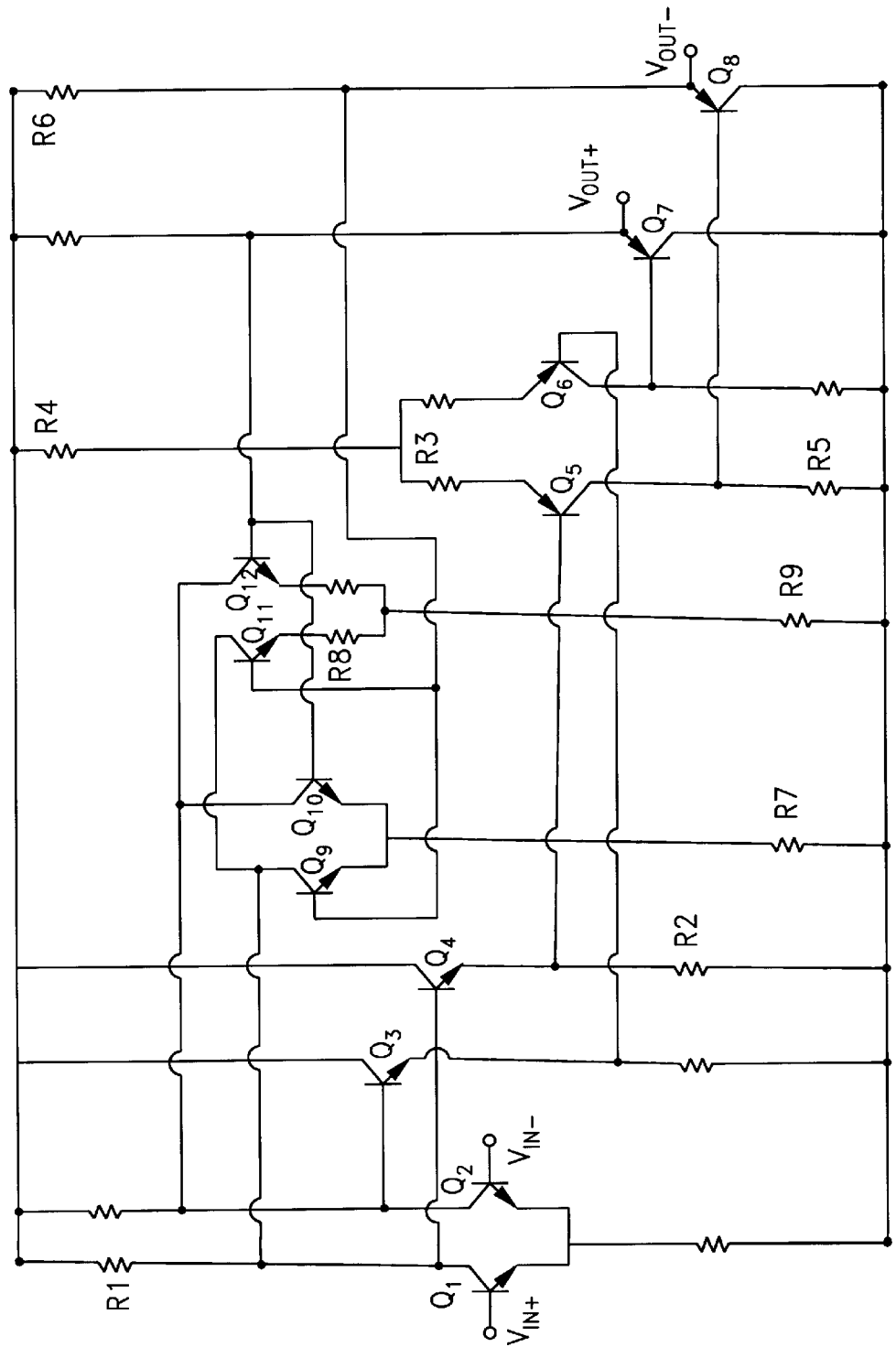
FIG. 6 is a simplified schematic of the compensator shown in FIG. 4.

As it is known in the art, there are two electrical specifications in signal transmission, single-ended and differential. The single-ended version uses a single line for each signal, referenced to a common ground. The differential version uses a pair of lines, sometimes referred to as "positive" and "negative", to differentiate actual signals from noise. Those skilled in the art will appreciate that the components of the control module 8 can be implemented in the single-ended version or the differential version depending on the requirements regarding noise. FIGS. 4, 7, 8, 10 and 11, therefore, show embodiments in the single-ended version for illustrative purposes, whereas FIG. 6 shows a component of the control module 8 in the differential version. However, it is contemplated that the two versions are equivalent.

A preferred embodiment of the compensator 38 is shown in FIG. 6. The compensator 38 is implemented in the differential version. The compensator 38 has inputs $V_{in+}$, $V_{in-}$ for first and second accumulated error signals, and outputs $V_{out+}$, $V_{out-}$ for first and second compensation signals. The compensator 38 is connected to ground and to a voltage supply providing a positive voltage. The compensator 38 comprises a first forward path generally formed by transistors Q1, Q4, Q5 and Q8 for the accumulated error signal $V_{in+}$, and a second forward path generally formed by transistors Q2, Q3, Q6 and Q7 for the accumulated error signal $V_{in-}$. Further, the compensator 38 comprises a first feedback circuit generally formed by transistors Q9 and Q11 which are connected between the output $V_{out-}$ of the first forward path and the input $V_{in+}$ of the first forward path. Similarly, a second feedback circuit is generally formed by transistors Q10 and Q12 which are connected between the output Vout+ of the second forward path and the input $V_{in-}$ of the second forward path. The transistors Q1–Q4, Q9–Q12 are npn transistors, and the transistors Q5–Q8 are pnp transistors, each having a base, a collector and an emitter.

In the first forward path and in the first feedback circuit, the transistors operate and are connected as set forth below. Those skilled in the art will appreciate that the transistors of the second forward path and the second feedback circuit operate and are connected correspondingly, as shown in FIG. 6 and not described in greater detail herein.

The collector of the transistor Q1 is connected to a resistor R1, to the collectors of the transistors Q9, Q11, and to the base of the transistor Q4. The collector of the transistor Q4 is connected to the voltage supply, and the emitter of the transistor Q4 is connected to a grounded resistor R2 and to the base of the transistor Q5. The emitter of the transistor Q5 is connected to the voltage supply via resistors R3, R4, and the collector of the transistor Q5 is connected to a grounded resistor R5 and to the base of the transistor Q8. The collector of the transistor Q8 is grounded and the emitter is connected to the base of the transistors Q9, Q11, and to the voltage supply via a resistor R6. The emitter of the transistor Q9 is connected to a grounded resistor R7, and the collector of the transistor Q11 is connected to ground via resistors R8, R9.

The resistors used in the compensator 38 are illustrated as passive resistors. However, it is contemplated that some of the resistors, for example, the resistors R2, R5, R6, R7, R9 can be implemented as active loads, for example, by means of bipolar transistors.

The transistors Q1, Q3, Q5 and Q8 of the first forward path operate to amplify the input signal $V_{in+}$ in accordance with a preset amplification factor. When a positive input voltage is applied to the base of the transistor Q1, the transistor Q1 is activated and an amplified version of the input voltage is applied to the base of the transistor Q4 which operates as emitter follower. The activated transistor Q4 draws a current which causes a voltage drop across the resistor R2 whereby the transistor Q5 is activated. Similarly, the transistor Q8 is activated drawing current through the resistor R6.

The first forward path generates an output signal $V_{out-}$ which is proportional to the input signal $V_{in+}$. As the emitter of the transistor Q8 is connected to the base of the transistor Q9 and Q11, the drawn current or the voltage drop across the resistor R6 determines when the transistors Q9 and Q11 are activated. When the transistor Q9 is active a current which depends on the output voltage $V_{out-}$ at the transistor Q8 is drawn through the resistor R1 and the collector of the transistor Q9 providing a negative feedback path which reduces the overall gain of the compensator 38. Because two serial resistors R8, R9 are connected to the emitter of the transistor Q11, a higher base-emitter voltage is needed to activate the transistor Q11 than to activate the transistor Q9. Thus, with an increasing output signal $V_{out-}$, the transistor Q11 is activated after the transistor Q9 is activated. When the transistor Q11 is active, an additional negative feedback is applied to the compensator 38.

Because the applied feedback is dependent on the output voltage $V_{out-}$, the nonlinear transfer function can be generated by selecting the forward amplification and the amount of the feedback.

The RF detector 30 (FIG. 4) receives a portion of the amplified RF signal which has a frequencies of 900 MHz or 1800 MHz and which is modulated by a speech or data signal. Such an RF signal must be detected before it can be processed. One example of an RF detector is a semiconductor diode which provides the amplitude of the RF signal. However, RF detectors with a semiconductor diode have a relatively low dynamic range. Therefore, in applications where a high dynamic range is desirable, other RF detectors may be used.

FIG. 7 shows an embodiment of an RF detector 30 which is preferably included in the control module 8 shown in FIG. 4. The illustrated RF detector 30 is a principal block diagram of a logarithmic detector which provides a dynamic range in excess of 50 dB. The RF detector 30 has an input 92 for receiving an RF signal (the coupled portion CS) and an output 94 for a DC voltage that corresponds to the power level of the RF signal CS. Advantageously, the RF detector 30 comprises four cascaded amplifiers 44, 46, 48, 50. Each amplifier 44–50 has a gain which is adjusted with respect to the remaining amplifiers 44–50 such that successive amplifiers 44–50 saturate at progressively higher power levels. As the power level increases after each amplifier 44–50, successive amplifiers saturate thereby reducing the rate of increase of the output voltage of the RF detector. Each amplifier output is connected to a detector 52, 54, 56, 58 whose output is connected to an adder 60 which sums all detected outputs of the amplifiers 44–50 thereby generating the output signal (OUT) of the logarithmic detector which is input to the differential amplifier 32 shown in FIG. 4.

The logarithmic detector is used in a feedback control loop, which includes the first power amplifier 4 or the second power amplifier 6, to control the power transmitted by the active power amplifier 4, 6. Besides that the logarithmic detector provides a wider dynamic range (greater than 50 dB in the illustrated embodiment) compared to a conventional diode detector, the logarithmic detector provides a linear voltage response. Such a wider dynamic range allows the power feedback control loop to remain in lock over a wider dynamic range which is of advantage as the GSM standard specifies power levels within a range of 70 dB (minimum to maximum). Further, the linear voltage response allows a simple linear transfer of the reference signal to the profile of the power output.

Furthermore, as discussed above, power amplifiers exhibit a gain saturation at higher output power levels, i.e., a given change in the input power level produces a smaller change in the output power level. This reduction in gain of a power amplifier, in turn, reduces the gain of the closed loop and the bandwidth of the power control loop. Ideally, such parameters as the bandwidth and the gain of the closed loop should remain constant within the operating range of the loop. Using the compensator 38 helps to maintain these parameters constant.

Figure 8:
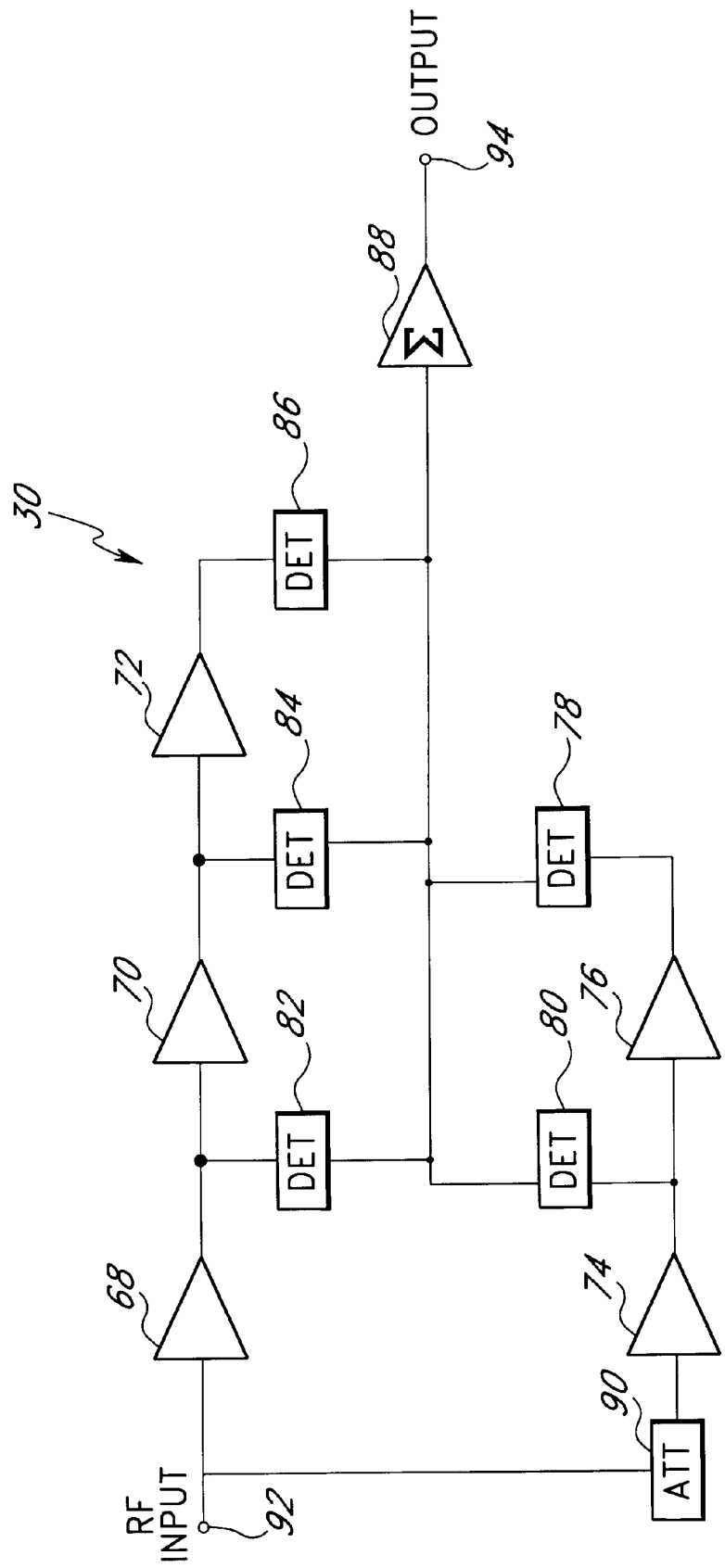
FIG. 8 shows the logarithmic RF detector in greater detail.

FIG. 8 shows a preferred embodiment of the logarithmic detector shown in FIG. 7. The input 92 of the illustrated logarithmic detector 30 receives the RF signal CS which is converted to a DC voltage and fed to the output 94. Internally, the logarithmic detector 30 has a branched signal path between the input 92 and an adder 88 which is connected to the output 94. A first signal path comprises cascaded amplifiers 68, 70, 72 and detectors 82, 84, 86 which are connected in accordance with the structure of the logarithmic detector shown in FIG. 7.

A second path comprises an attenuator 90, amplifiers 74, 76, and detectors 78, 80. The attenuator 90 is interconnected between the input 92 and an input of the amplifier 74 which is operated as a gain buffer with unity gain. The output of the amplifier 74 is input to the amplifier 76 and also to the detector 80 which is connected to the adder 88. Similarly, the output of the amplifier 76 is input to the detector 78 which is also connected to the adder 88.

Each detector 78, 80, 82, 84, 86 is a full-wave rectifier which converts an RF signal into a DC voltage which is input to the adder 88.

The attenuator 90 has a preset attenuation, for example, an attenuation of about 20 dB. In the second path, the portion of the incoming RF signal CS is first attenuated before the RF signal CS is detected, whereas in the first path, the RF signal CS is not attenuated. Advantageously, the logarithmic detector 30 allows detection signal having a higher power level so that the RF signal CS is detected without increasing the DC power consumption of the logarithmic detector.

Figure 9:
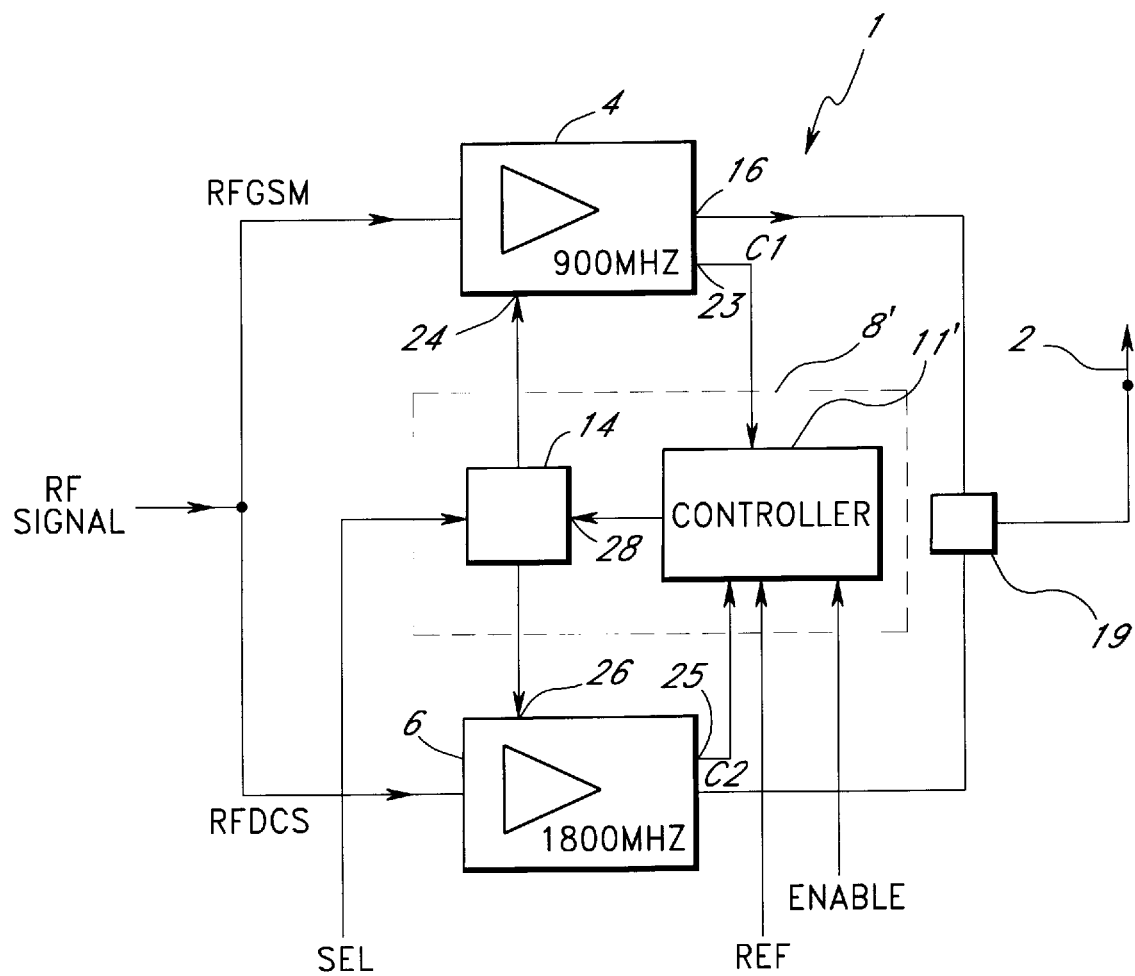
FIG. 9 is a block diagram of a second embodiment of a dual band transmitter for a cellular phone made in accordance with the present invention.

FIG. 9 shows a block diagram of a second embodiment of the dual band transmitter 1 shown in FIG. 3B. The second embodiment of the dual band transmitter 1 has a structure which is similar to the structure of the first embodiment of the dual band transmitter 1. Therefore, regarding a description of the general structure of the second embodiment reference is made to the description of FIG. 3B, and only deviations of this general structure are described hereinafter.

A controller 11' which is part of a control module 8' controls the switch 14 as described with reference to FIG. 3B. The control module 8' also receives the control signals SEL, REF and ENABLE.

Figure 11:
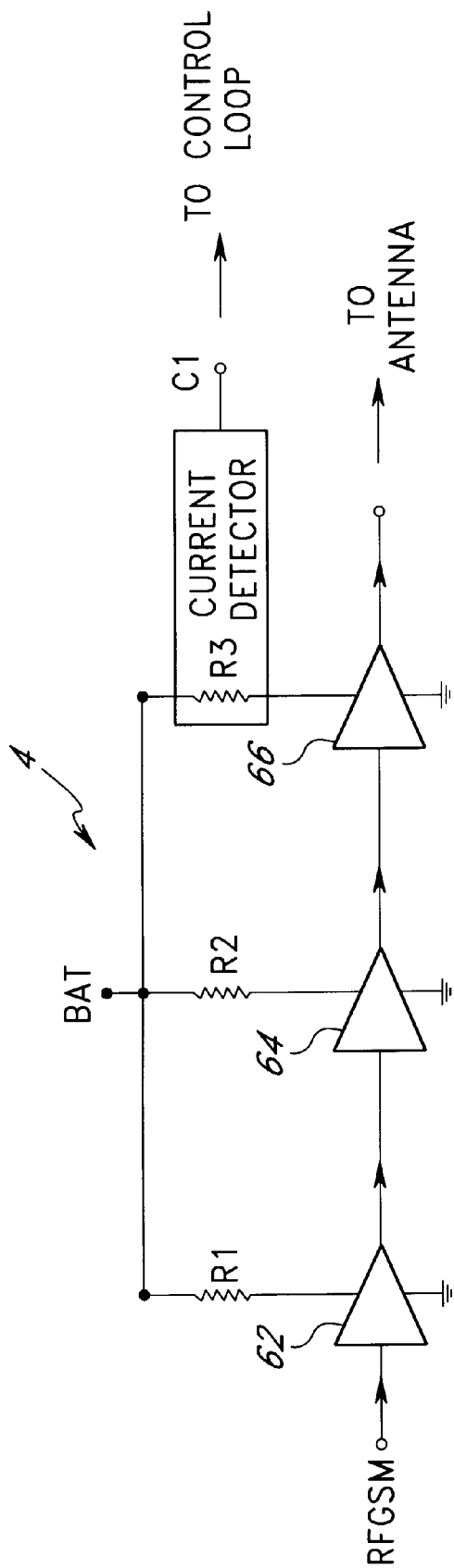
FIG. 11 is a block diagram of a power amplifier included in the second embodiment of the dual band transmitter.

In this second embodiment, the controller 11' receives control signals C1, C2 which originate from the power amplifiers 4, 6, respectively. The control signal C1 is indicative of a current drawn by a final amplification stage of an active power amplifier 4, which is shown in FIG. 11 in greater detail. This current is an accurate indication of the RF power transmitted by the power amplifier 4. As long as the output impedance of the power amplifier 4 is constant, this measurement of the transmitted RF power is essentially independent from the radio frequency.

Correspondingly, the control signal C2 is indicative of a current drawn by a final amplification stage of the power amplifier 6. It is contemplated that only an active power amplifier 4, 6 generates one of these control signals C1, C2 so that only one control signal C1, C2 is available at a time.

Figure 10:
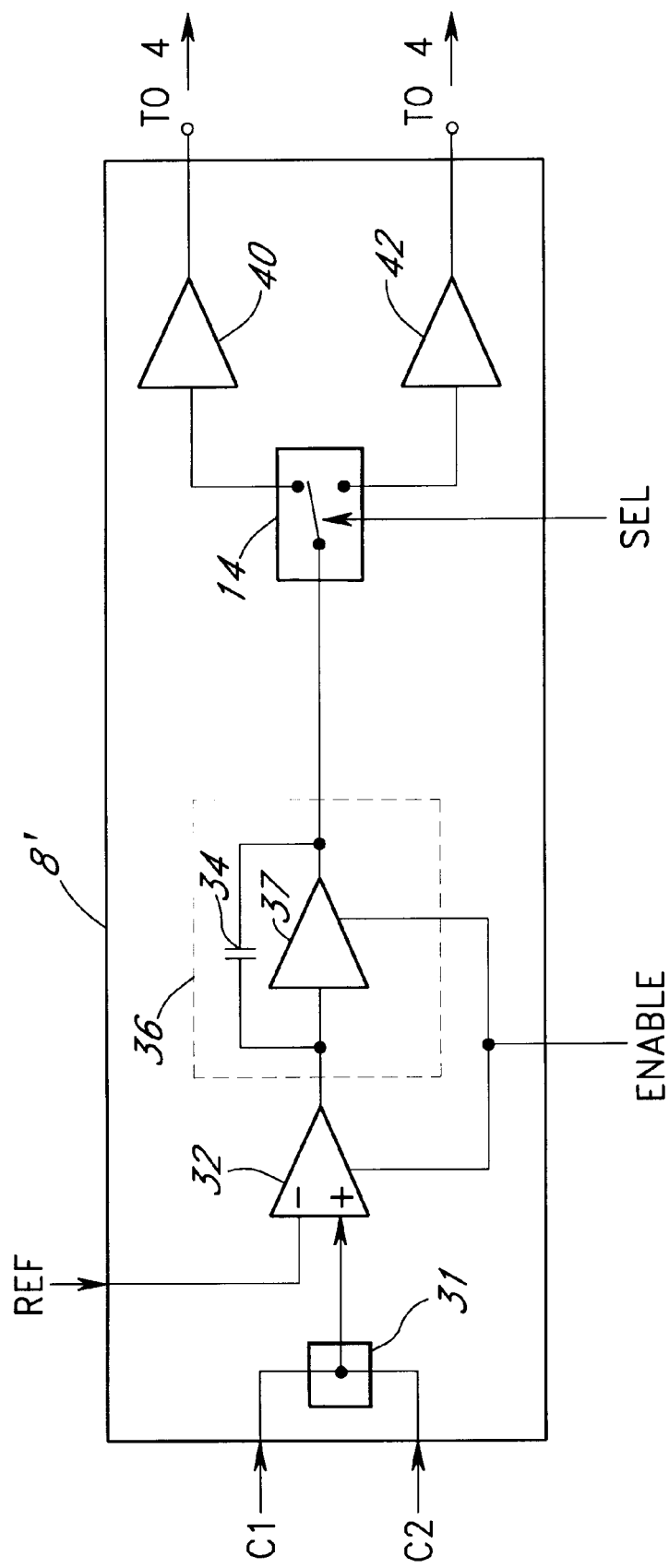
FIG. 10 is a block diagram of a second embodiment of a control module included in the dual band transmitter of FIG. 9.

As indicated in FIGS. 9, 10, the outputs 23, 25 of the power amplifiers 4, 6, respectively, are connected to a switch 31 within the control module 8'. Because only one control signal C1, C2 is available at a time, only one control signal C1, C2 is output from the switch 31 and input to the differential amplifier 32. Preferably, the switch 31 is electrically controllable, for example, a diode switch.

The integrator 36 comprises the operational amplifier 37 and the capacitor 34 which determines the time constant of the integrator 36 as discussed above. The integrator 36 outputs a signal which corresponds to the accumulated difference between the control signal REF and the selected control signal C1, C2. It is contemplated that a positive error (i.e, the reference signal REF is larger than the control signal C1, C2) is added to, and that a negative error (i.e., the reference signal REF is smaller than the control signal C1, C2) is subtracted from the accumulated error signal.

The integrator 36 is connected to the switch 14 which is controlled by the control signal SEL. Depending on the position of the switch 14, the output of the integrator 38 is either input to a driver amplifier 40 for GSM900 operation or input to a driver amplifier 42 for DCS1800 operation. Further components of the control module 8' are described above in connection with FIG. 4.

A schematic illustration of a power amplifier 4 is shown in FIG. 11. The power amplifier 4 comprises three cascaded amplification stages 62, 64, 66, which are advantageously transistor stages, such as in the power amplifier devices RF130, RF230 available from Rockwell Semiconductor Systems. Other conventional power amplifiers are also acceptable. The first amplification stage 62 receives an RF signal, for example, the signal RFGSM as shown in FIG. 9. The third amplification stage 66 outputs an amplified RF signal and feeds it to the antenna 2. Each amplification stage 62, 64, 66 is connected to a battery terminal BAT via a resistor R1, R2, R3, respectively. The resistors R1, R2, R3 represent supply traces leading to the amplification stages 62, 64, 66. The current drawn can be determined by measuring the voltage drop in the supply traces, i.e. across the resistor R3, leading to the final amplification stage 66. The power level of the amplified RF signal is proportional to the drawn current, so that a certain value of drawn current corresponds to a certain power level of the amplified RF signal.

In addition to the advantage of sharing a common control module 8' by the power amplifiers 4, 6, the second embodiment of the dual band transmitter 1 allows to overcome difficulties in sampling, as the RF power level is not directly sampled but inferred from a low frequency/DC current measurement. This also removes a need for a radio frequency detector circuit. Thus, measuring the drawn current provides a simple method of detecting the power level of an emitted RF signal and to use the drawn current in a power control circuit in a dual band cellular phone.

Although this invention has been described in terms of certain preferred embodiments, other embodiments that are apparent to those of ordinary skill in the art are also within the scope of this invention. Accordingly, the scope of the invention is intended to be defined by the claims that follow.

What is claimed is:

1. A cellular phone for a mobile communications system, said phone being operable at a first radio frequency band and a second radio frequency band comprising a dual band transmitter and an antenna, said dual band transmitter comprising:
  a first power amplifier, said first power amplifier having a first input for a first signal at said first radio frequency band, a second input for a first control signal and a first output for an amplified first signal, said first output being connectable to said antenna;
  a second power amplifier, said second power amplifier having a third input for a second signal at said second radio frequency band, a fourth input for a second control signal and a second output for an amplified second signal, said second output being connectable to said antenna; and
  a control module, said control module being associated with said first and second outputs to receive a portion of one of said amplified first and second signals, and generating one of said first and second control signals to control one of said first and second power amplifiers, said control signal being a function of one of said first and second amplified signals and a reference signal, said control module comprising:
  a detector having an input for a portion of an amplified signal derived from one of said amplified first and second signals, and an output for a detection signal indicative of the power level of said amplified signal;
  a comparator having an input which receives said reference signal and having an input which receives said detection signal, said comparator generating an error signal corresponding to a difference between said reference signal and said detection signal; and
  a shaping circuit, said circuit weighing said error signal in accordance with a predetermined desired power characteristic to generate said control signal which accounts, at least in part, for nonlinear amplification characteristics of said power amplifiers.

2. The cellular phone of claim 1, wherein said first radio frequency band is about 900 MHz, and said second radio frequency band is about 1800 MHz.

3. The cellular phone of claim 1, wherein said first radio frequency band is about 800 MHz, and said second radio frequency band is about 1900 MHz.

4. The cellular phone of claim 1, wherein said comparator comprises a differential amplifier.

5. The cellular phone of claim 4, further comprising an integrator, said integrator integrating said error signal to output an integrated error signal, and wherein said shaping circuit weights said integrated error signal as said error signal.

6. The cellular phone of claim 1, wherein said control module further comprises a switch, said switch being controllable and feeding said control signal to one of said power amplifiers.

7. The cellular phone of claim 6, wherein said control module further comprises a first amplifier and a second amplifier, said first amplifier being connected to a first terminal of said switch and driving said first power amplifier, and said second amplifier being connected to a second terminal of said switch and driving said second power amplifier.

8. The cellular phone of claim 1, wherein said detector is a logarithmic detector.

9. The cellular phone of claim 8, wherein said logarithmic detector comprises a first signal path and a second signal path, said first and second signal paths being joined at an input of the logarithmic detector and at a summing stage associated with an output of the logarithmic detector, said first signal path comprising a serial arrangement of a first number of amplifiers and an equal number of detectors, each detector being interconnected between an output of an amplifier and an input of the summing stage, said second signal path comprising a serial arrangement of an attenuator, a second number of amplifiers and an equal number of detectors, each detector being interconnected between an output of an amplifier and an input of the summing stage, said attenuator being interconnected between the input of the logarithmic detector and a first amplifier of the second signal path.

10. The cellular phone of claim 9, wherein said first signal path comprises three amplifiers and said second signal path comprises two amplifiers.

11. A transmitter for a cellular phone comprising an antenna and being operable at a first radio frequency band and a second radio frequency band, said transmitter comprising:
  a first power amplifier, said first power amplifier having a first input for a first signal at said first radio frequency band, a second input for a first control signal and a first output for an amplified first signal, said first output being connectable to said antenna;
  a second power amplifier, said second power amplifier having a third input for a second signal at said second radio frequency band, a fourth input for a second control signal and a second output for an amplified second signal, said second output being connectable to said antenna; and
  a control module, said control module being associated with said first and second outputs to receive a portion of one of said amplified first and second signals, and generating one of said first and second control signals to control one of said first and second power amplifiers, said control signal being a function of one of said first and second amplified signals and a reference signal, said control module comprising:
  a detector, said detector having an input for a portion of an amplified signal derived from one of said amplified first and second signals, and an output which, responsive to said input, provides a detection signal corresponding to said portion;

a comparator having an input which receives said reference signal and having an input which receives said detection signal, said comparator generating an error signal corresponding to a difference between said reference signal and said detector signal; and a shaping circuit, said circuit weighting said error signal in accordance with a predetermined desired power characteristic to generate said control signal which accounts, at least in part, for nonlinear amplification characteristics of said power amplifiers.

12. The transmitter of claim 11, wherein said comparator comprises a differential amplifier.

13. The transmitter of claim 12, further comprising an integrator, said integrator integrating said error signal to output an integrated error signal, and wherein said shaping circuit weights said integrated error signal as said error signal.

14. The transmitter of claim 11, wherein said control module further comprises a switch, said switch being controllable and feeding said control signal to one of said power amplifiers.

15. The transmitter of claim 14, wherein said control module further comprises a first amplifier and a second amplifier, said first amplifier being connected to a first terminal of said switch and driving said first power amplifier, and said second amplifier being connected to a second terminal of said switch and driving said second power amplifier.

16. The transmitter of claim 15, wherein said detector is a logarithmic detector.

17. The transmitter of claim 16, wherein said logarithmic detector comprises a first signal path and a second signal path, said first and second signal paths being joined at an input of the logarithmic detector and at a summing stage associated with an output of the logarithmic detector, said first signal path comprising a serial arrangement of a first number of amplifiers and an equal number of detectors, each detector being interconnected between an output of an amplifier and an input of the summing stage, said second signal path comprising a serial arrangement of an attenuator, a second number of amplifiers and an equal number of detectors, each detector being interconnected between an output of an amplifier and an input of the summing stage, said attenuator being interconnected between the input of the logarithmic detector and a first amplifier of the second signal path.

18. The transmitter of claim 17, wherein said first signal path comprises three amplifiers and said second signal path comprises two amplifiers.

19. A control module for a dual band transmitter in a cellular phone, said dual band transmitter comprising first and second power amplifiers, said module comprising:

a logarithmic detector, said detector having an input which receives a portion of a signal derived from an amplified RF signal, and an output, which in response to said input, provides a detection signal corresponding to said signal portion;

a differential amplifier, said differential amplifier having a reference input which receives a reference signal and having a detection signal input which receives said detection signal, said amplifier generating an error signal corresponding to a difference between said reference signal and said detector signal;

an integrator, said integrator integrating said error signal and generating an integrated error signal; and a shaping circuit, said circuit weighting said integrated error signal in accordance with a predetermined power level characteristic to generate said control signal which accounts, at least in part, nonlinear amplification characteristics of said power amplifiers.

20. The control module of claim 19, further comprising a switch, said switch being controllable and feeding said control signal to one of said power amplifiers.

21. The control module of claim 20, further comprising a first amplifier and a second amplifier, said first amplifier being connected to a first terminal of said switch and driving said first power amplifier, and said second amplifier being connected to a second terminal of said switch and driving said second power amplifier.

22. The control module of claim 19, wherein said logarithmic detector comprises a first signal path and a second signal path, said first and second signal paths being joined at an input of the logarithmic detector and at a summing stage associated with an output of the logarithmic detector, said first signal path comprising a serial arrangement of a first number of amplifiers and an equal number of detectors, each detector being interconnected between an output of an amplifier and an input of the summing stage, said second signal path comprising a serial arrangement of an attenuator, a second number of amplifiers and an equal number of detectors, each detector being interconnected between an output of an amplifier and an input of the summing stage, said attenuator being interconnected between the input of the logarithmic detector and a first amplifier of the second signal path.

23. A method for controlling an output power level of a dual band cellular phone, comprising the steps of:

providing a dual band transmitter comprising a single control module, and first and second power amplifiers which are coupled to an antenna;

activating one of said first and second power amplifiers;

feeding an RF signal to said activated power amplifier;

amplifying said RF signal with said activated power amplifier;

feeding said amplified RF signal to said antenna;

coupling a portion from said amplified RF signal;

feeding said portion to said single control module;

detecting said portion and generating a detector signal corresponding to said portion;

comparing said detector signal with a reference signal to generate an error signal corresponding to a difference between said reference signal and said detector signal;

weighing said error signal in accordance with a predetermined desired power characteristic to generate a control signal which accounts, at least in part, for nonlinear amplification characteristics of said power amplifiers; and feeding said control signal to the activated power amplifier to control the activated power amplifier to provide an amplified RF signal which is in accordance with a desired signal characteristic defined by the reference signal.

24. A cellular phone for a mobile communications system, said phone being operable at a first radio frequency band and a second radio frequency band comprising a dual band transmitter and an antenna, said dual band transmitter comprising:

a first power amplifier, said first power amplifier having a first input for a first signal at said first radio frequency band, a second input for a first control signal and a first output for an amplified first signal, said first output being connectable to said antenna;

a second power amplifier, said second power amplifier having a third input for a second signal at said second radio frequency band, a fourth input for a second control signal and a second output for an amplified second signal, said second output being connectable to said antenna; and a control module, said control module being associated with said first and second outputs to receive a portion of one of said amplified first and second signals, and generating one of said first and second control signals to control one of said first and second power amplifiers, said control signal being a function of one of said first and second amplified signals and a reference signal, said control module comprising:

a logarithmic detector having an input for a portion of an amplified signal derived from one of said amplified first and second signals, and an output for a detection signal indicative of the power level of said amplified signal, wherein said logarithmic detector comprises a first signal path and a second signal path, said first and second signal paths being joined at an input of the logarithmic detector and at a summing stage associated with an output of the logarithmic detector, said first signal path comprising a serial arrangement of a first number of amplifiers and an equal number of detectors, each detector being interconnected between an output of an amplifier and an input of the summing stage, said second signal path comprising a serial arrangement of an attenuator, a second number of amplifiers and an equal number of detectors, each detector being interconnected between an output of an amplifier and an input of the summing stage, said attenuator being interconnected between the input of the logarithmic detector and a first amplifier of the second signal path;

a comparator having an input which receives said reference signal and having an input which receives said detection signal, said comparator generating an error signal corresponding to a difference between said reference signal and said detection signal; and a shaping circuit, said circuit weighting said error signal in accordance with a predetermined desired power characteristic to generate said control signal which accounts, at least in part, for nonlinear amplification characteristics of said power amplifiers.

25. A transmitter for a cellular phone comprising an antenna and being operable at a first radio frequency band and a second radio frequency band, said transmitter comprising:

a first power amplifier, said first power amplifier having a first input for a first signal at said first radio frequency band, a second input for a first control signal and a first output for an amplified first signal, said first output being connectable to said antenna;

a second power amplifier, said second power amplifier having a third input for a second signal at said second radio frequency band, a fourth input for a second control signal and a second output for an amplified second signal, said second output being connectable to said antenna; and a control module, said control module being associated with said first and second outputs to receive a portion of one of said amplified first and second signals, and generating one of said first and second control signals to control one of said first and second power amplifiers, said control signal being a function of one of said first and second amplified signals and a reference signal, said control module comprising:

a logarithmic detector, said detector having an input for a portion of an amplified signal derived from one of said amplified first and second signals, and an output which, responsive to said input, provides a detection signal corresponding to said portion, wherein said logarithmic detector comprises a first signal path and a second signal path, said first and second signal paths being joined at an input of the logarithmic detector and at a summing stage associated with an output of the logarithmic detector, said first signal path comprising a serial arrangement of a first number of amplifiers and an equal number of detectors, each detector being interconnected between an output of an amplifier and an input of the summing stage, said second signal path comprising a serial arrangement of an attenuator, a second number of amplifiers and an equal number of detectors, each detector being interconnected between an output of an amplifier and an input of the summing stage, said attenuator being interconnected between the input of the logarithmic detector and a first amplifier of the second signal path;

a comparator having an input which receives said reference signal and having an input which receives said detection signal, said comparator generating an error signal corresponding to a difference between said reference signal and said detector signal; and a shaping circuit, said circuit weighting said error signal in accordance with a predetermined desired power characteristic to generate said control signal which accounts at least in part, for nonlinear amplification characteristics of said power amplifiers.

26. The transmitter of claim 25, wherein said first signal path comprises three amplifiers and said second signal path comprises two amplifiers.

27. A control module for a dual band transmitter in a cellular phone, said dual band transmitter comprising first and second power amplifiers, said module comprising:

a logarithmic detector, said detector having an input which receives a portion of a signal derived from an amplified RF signal, and an output, which in response to said input, provides a detection signal corresponding to said signal portion, wherein said logarithmic detector comprises a first signal path and a second signal path, said first and second signal paths being joined at an input of the logarithmic detector and at a summing stage associated with an output of the logarithmic detector, said first signal path comprising a serial arrangement of a first number of amplifiers and an equal number of detectors, each detector being interconnected between an output of an amplifier and an input of the summing stage, said second signal path comprising a serial arrangement of an attenuator, a second number of amplifiers and an equal number of detectors, each detector being interconnected between an output of an amplifier and an input of the summing stage, said attenuator being interconnected between the input of the logarithmic detector and a first amplifier of the second signal path;

a differential amplifier, said differential amplifier having a reference input which receives a reference signal and having a detection signal input which receives said detection signal, said amplifier generating an error signal corresponding to a difference between said reference signal and said detector signal;

an integrator, said integrator integrating said error signal and generating an integrated error signal; and a shaping circuit, said circuit weighting said integrated error signal in accordance with a predetermined power level characteristic to generate said control signal which accounts, at least in part, nonlinear amplification characteristics of said power amplifiers.

* * * * *